United States Patent
Wu

(10) Patent No.: US 7,332,791 B2
(45) Date of Patent: Feb. 19, 2008

(54) ELECTRICALLY PROGRAMMABLE POLYSILICON FUSE WITH MULTIPLE LEVEL RESISTANCE AND PROGRAMMING

(75) Inventor: Shien-Yang Wu, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/223,069

(22) Filed: Sep. 9, 2005

(65) Prior Publication Data

US 2006/0006494 A1 Jan. 12, 2006

Related U.S. Application Data

(62) Division of application No. 10/690,995, filed on Oct. 22, 2003, now abandoned.

(51) Int. Cl.
*H01L 29/00* (2006.01)
(52) U.S. Cl. .................. 257/529; 257/530; 257/665
(58) Field of Classification Search ............... 257/529, 257/530, 665
See application file for complete search history.

(56) References Cited

U.S. PATENT DOCUMENTS

| | | | | |
|---|---|---|---|---|
| 4,689,494 A * | 8/1987 | Chen et al. | .................. | 327/525 |
| 5,966,339 A * | 10/1999 | Hsu et al. | .................. | 365/225.7 |
| 6,008,523 A * | 12/1999 | Narayan et al. | ............. | 257/529 |
| 6,175,261 B1 | 1/2001 | Sundararaman et al. | ..... | 327/525 |
| 6,242,790 B1 | 6/2001 | Tsui et al. | ................... | 257/529 |
| 6,323,534 B1 * | 11/2001 | Marr et al. | .................. | 257/529 |
| 6,356,496 B1 | 3/2002 | Carroll et al. | ............ | 365/225.7 |
| 6,410,367 B2 * | 6/2002 | Marr et al. | .................. | 438/132 |
| 6,483,166 B2 * | 11/2002 | Benedix | ...................... | 257/529 |
| 6,495,902 B2 * | 12/2002 | Marr et al. | .................. | 257/529 |
| 6,507,087 B1 * | 1/2003 | Yu | .............................. | 257/529 |
| 6,551,864 B2 * | 4/2003 | Marr et al. | .................. | 438/132 |
| 6,642,601 B2 * | 11/2003 | Marshall et al. | ............ | 257/529 |
| 6,661,330 B1 * | 12/2003 | Young | ........................ | 337/297 |
| 6,709,980 B2 * | 3/2004 | Gleason | ...................... | 438/678 |
| 6,753,482 B1 * | 6/2004 | Schoenfeld et al. | ........ | 174/261 |
| 6,819,132 B2 * | 11/2004 | Byrd | .......................... | 324/765 |
| 6,879,018 B2 * | 4/2005 | Marr et al. | .................. | 257/529 |
| 6,914,275 B2 * | 7/2005 | Schoenfeld et al. | ........ | 257/208 |
| 6,933,591 B1 * | 8/2005 | Sidhu et al. | ................ | 257/665 |
| 6,979,601 B2 * | 12/2005 | Marr et al. | .................. | 438/132 |
| 7,007,375 B2 * | 3/2006 | Schoenfeld et al. | .......... | 29/623 |
| 7,054,180 B2 * | 5/2006 | Schamberger et al. | ........ | 365/96 |
| 7,153,712 B1 * | 12/2006 | Sidhu et al. | .................. | 438/17 |
| 7,254,078 B1 * | 8/2007 | Park et al. | ............... | 365/225.7 |
| 7,257,884 B2 * | 8/2007 | Schoenfeld et al. | .......... | 29/623 |
| 2002/0005564 A1 * | 1/2002 | Marr et al. | .................. | 257/529 |
| 2002/0102755 A1 * | 8/2002 | Marr et al. | .................... | 438/22 |
| 2003/0102520 A1 * | 6/2003 | Marr et al. | .................. | 257/529 |
| 2003/0211661 A1 * | 11/2003 | Marr et al. | ................. | 438/128 |

* cited by examiner

*Primary Examiner*—Laura M. Schillinger
(74) *Attorney, Agent, or Firm*—Thomas, Kayden, Horstemeyer & Risley

(57) ABSTRACT

A method to form a programmable resistor device in an integrated circuit device is achieved. The method comprises depositing a semiconductor layer overlying a substrate. The semiconductor layer is patterned to form a plurality of lines. The lines are electrically parallel between a first terminal and a second terminal. Any of the lines may be blown open by a current forced from the first terminal to the second terminal. A metal-semiconductor alloy is selectively formed overlying a first group of the lines but not overlying a second group of the lines. A method to program the programmable resistor device is described.

7 Claims, 5 Drawing Sheets

ELECTRICALLY PROGRAMMABLE POLYSILICON FUSE WITH MULTIPLE LEVEL RESISTANCE AND PROGRAMMING

CROSS-REFERENCE TO RELATED APPLICATION

This application is a divisional of U.S. patent application Ser. No. 10/690,995, filed Oct. 22, 2003, now abandoned.

BACKGROUND OF THE INVENTION (1) Field of the Invention

The invention relates to an on-chip fuse device, and, more particularly, to an electrically programmable, polysilicon fuse with multiple level resistance.

(2) Description of the Prior Art

In the art of integrated circuits, many methods are used to provide manufacturing flexibility. Of particular importance are techniques that allow a common circuit design to be easily configured to specific applications or to parametric requirements with little or no effect on the manufacturing process. An example of a configuration method is the use of on-chip programmable fuses. A fuse is a conductive element that can be made into an open circuit. When the element is a conductor, the circuit operates according to a first configuration. When the element is open circuit, the circuit operates according to a second configuration. A typical prior art, on-chip fuse is simply a metal line. A metal line can be made an open circuit by cutting through the line using a laser. This type of fuse can be very useful. However, it requires a laser cutting source that is external to the circuit.

An alternative method to form a programmable fuse is a polysilicon line. A polysilicon line can be made an open circuit, or blown, by conducting a current through the polysilicon line that exceeds the current density capability of the material. Programmable polysilicon fuses such as this are found in the art. These fuses have a limitation, however, of only being binary devices. The fuses either are a conductive line or are an open circuit. These states may be thought of as a '0' state or a '1' state. It is highly advantageous to form a programmable fuse device that is capable of multiple states.

Several prior art inventions relate to on-chip fuses. U.S. Pat. No. 6,356,496 B1 to Carroll et al describes a method to form polysilicon resistors. The resistors are fuses that can be blown to adjust the value. U.S. Pat. No. 6,242,790 B1 to Tsui et al describes a method to form a variable resistance based on polysilicon resistor/fuses. U.S. Pat. No. 6,175,261 B1 to Sundaraman et al discloses an on-chip fuse circuit.

SUMMARY OF THE INVENTION

A principal object of the present invention is to provide an effective and very manufacturable integrated circuit device.

A further object of the present invention is to provide a method to form a programmable polysilicon fuse device capable of multiple states.

A yet further object of the present invention is to provide a method to form a programmable polysilicon fuse device with minimal impact on a CMOS process.

A yet further object of the present invention is to provide a method to form a programmable polysilicon fuse device where the state of the device depends on the parallel combination of polysilicon resistors.

A yet further object of the present invention is to provide a method to form a programmable polysilicon fuse device where the device is capable of performing in more than two states depending on how many resistors are open circuited.

A yet further object of the present invention is to provide a method to form a programmable polysilicon fuse device where the relative resistance of any resistor is controlled by the selective formation of metal silicide.

A yet further object of the present invention is to provide a method to form a programmable polysilicon fuse device where the relative resistance of any resistor is controlled by the selective doping of the resistor.

Another further object of the present invention is to provide a method to program the programmable polysilicon fuse device using on-chip current sources.

A yet further object of the present invention is to provide a method to program the programmable polysilicon fuse device that is capable of programming to more than two states using multiple pulses of current.

In accordance with the objects of this invention, a method to form a programmable resistor device in an integrated circuit device is achieved. The method comprises depositing a semiconductor layer overlying a substrate. The semiconductor layer is patterned to form a plurality of lines. The lines are electrically parallel between a first terminal and a second terminal. Any of the lines may be blown open by a current forced from the first terminal to the second terminal. A metal-semiconductor alloy is selectively formed overlying a first group of the lines but not overlying a second group of the lines.

Also in accordance with the objects of this invention, a programmable resistor device in an integrated circuit device is achieved. The device comprises a plurality of lines comprising a semiconductor layer overlying a substrate. The lines are electrically parallel between a first terminal and a second terminal. Any of the lines may be blown open by a current forced from the first terminal to the second terminal. A metal-semiconductor alloy overlies a first group of the lines but does not overlie a second group of the lines.

Also in accordance with the objects of this invention, a method to program a programmable resistor device is achieved. The device comprises a plurality of lines comprising a semiconductor layer overlying a substrate. The lines are electrically parallel between a first terminal and a second terminal. Any of the lines may be blown open by a current forced from the first terminal to the second terminal. A metal-semiconductor alloy overlies a first group of the lines but does not overlie a second group of the lines. The device comprises a first resistance between the first and second terminals. The method comprises forcing a programming current from the first terminal to the second terminal. The programming current causes a first line in the first group to blow such that the device comprises a second resistance between the first and second terminals. The programming current is then removed.

BRIEF DESCRIPTION OF THE DRAWINGS

In the accompanying drawings forming a material part of this description, there is shown.

DESCRIPTION OF THE PREFERRED EMBODIMENTS

The preferred embodiments of the present invention disclose a method to form a programmable fuse device. The device is described herein. A method to program the device into more than two states is disclosed. It should be clear to those experienced in the art that the present invention can be applied and extended without deviating from the scope of the present invention.

Figure 1:
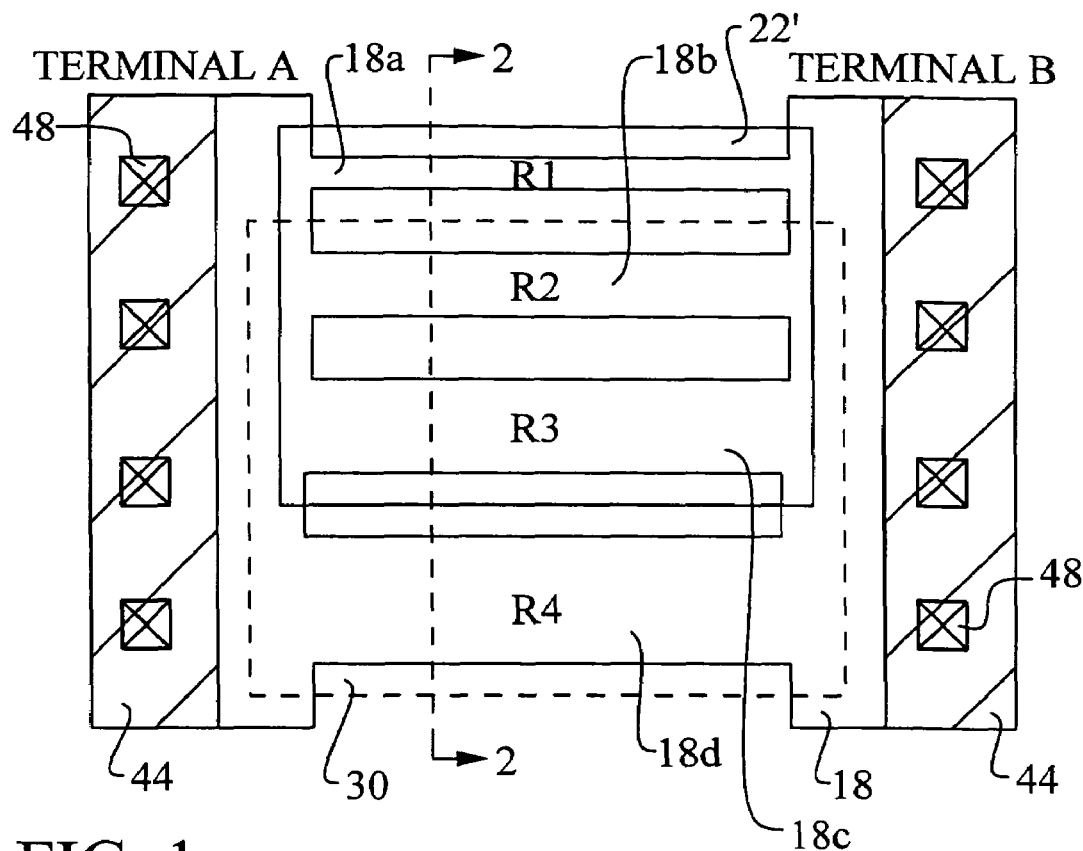
FIG. 1 illustrates a preferred embodiment of the present invention showing a top view of a programmable resistor device.
Figure 2:
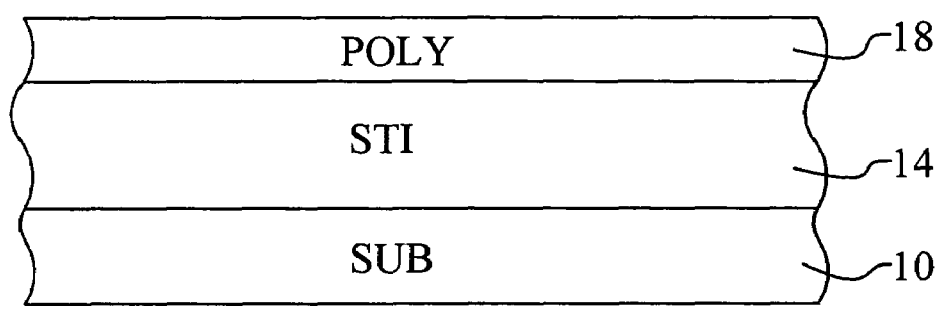
FIGS. 2 through 6 illustrate a preferred embodiment of the present invention showing a method to form a programmable resistor device.

Referring now to FIG. 1, a preferred embodiment of the present invention is illustrated. Several important features of the present invention are shown and discussed below. A top view of a programmable fuse device is shown. The device comprises a plurality of lines R1 18a, R2 18b, R3 18c, and R4 18d comprising a semiconductor layer 18 overlying a substrate. As an important feature, the lines 18a, 18b, 18c, and 18d are electrically parallel between a first terminal TERMINAL A and a second terminal TERMINAL B. Any of the lines 18a, 18b, 18c, and 18d may be blown open by a current forced from TERMINAL A to TERMINAL B.

As another important feature, a metal-semiconductor alloy overlies a first group of the lines, such as R1 18a, but not does not overlie a second group of the lines, such as R2 18b, R3 18c, and R4 18d. The metal-semiconductor alloy is selectively formed overlying the first group R1 18a but not the second group R2 18b, R3 18c, and R4 18d through the use of a metal-semiconductor mask 30 as will be further described below. By selectively forming a metal-semiconductor alloy over part of the lines, significantly different resistance values can be created. For example, if the metal-semiconductor alloy is formed overlying the R1 18a line, as shown, then this line will exhibit a very low resistivity value. Even though the line R1 18a is the most narrow line, the selective inclusion of the metal-semiconductor alloy makes the R1 18a line the lowest value resistor. The resulting thin cross section of R1 18a, coupled with the low resistance value due to the metal-semiconductor alloy, causes the R1 18a line to be blown first when the device is subjected to a current pulse exceeding the minimum programming value as will be described below.

As another important feature, some of the lines, in this case R1 18a, R2 18b, and R3 18c, are doped while other lines, in this case R4 18, are undoped. The selective doping or non-doping of lines also creates large differences in the resistivity of the lines. Undoped lines R4 18d will have much larger resistivity values than doped lines R1 18a, R2 18b, and R3 18c. The selective doping allows significantly differing resistor values to be generated. As another important feature, the widths of the lines R1 18a, R2 18b, R3 18c, and R4 18d can be made different for each line. This also allows different resistor values to be generated.

Referring now to FIGS. 2-6, the programmable fuse device is illustrated in cross section. Several important features of the present invention are shown and discussed. In particular, the key features of a preferred method of formation of the present invention are described. Referring again to FIG. 2, as a first preferred feature, a substrate 10 is provided. The substrate 10 may comprise any semiconductor material or may comprise a semiconductor on insulator (SOI) material. Preferably, the substrate 10 comprises silicon. An insulating layer 14 is shown formed overlying the substrate 10. This insulating layer 14 is shown as a shallow trench isolation 14. Alternatively, local field oxidation (LOCOS) could be used to create a non-active area.

As an important feature, a semiconductor layer 18 is formed overlying the substrate 10 and, preferably, overlying the insulating layer 14. Known semiconductor materials may be used to form the semiconductor layer 18. However, it is preferred that the semiconductor layer 18 comprises silicon and, more preferred, that the layer 18 comprises polysilicon. For example, a polysilicon layer 18 of between about 500 Å and about 2,500Å is formed overlying the insulator layer 14. In the most preferred case, the polysilicon layer 18 comprises the same polysilicon layer used in the formation of transistor gates for CMOS devices on the integrated circuit device. In this way, the method of formation of the present invention can be performed with minimal changes to the standard production process. The polysilicon layer 18 may be deposited, for example, using a chemical vapor deposition (CVD) process.

The semiconductor layer 18 may be formed as an intrinsic layer or as a doped layer. If intrinsic, then the semiconductor layer 18 has a very low, dopant ion concentration. If doped, then the dopant ion, such as phosphorous, boron, or arsenic, concentration is sufficiently high to cause the semiconductor layer 18 to be described as n-type or p-type. If a polysilicon layer 18 is used, then this film may be deposited intrinsically or deposited with insitu doping. Alternatively, the polysilicon may be conformally doped after deposition to a desired starting concentration.

Figure 3:
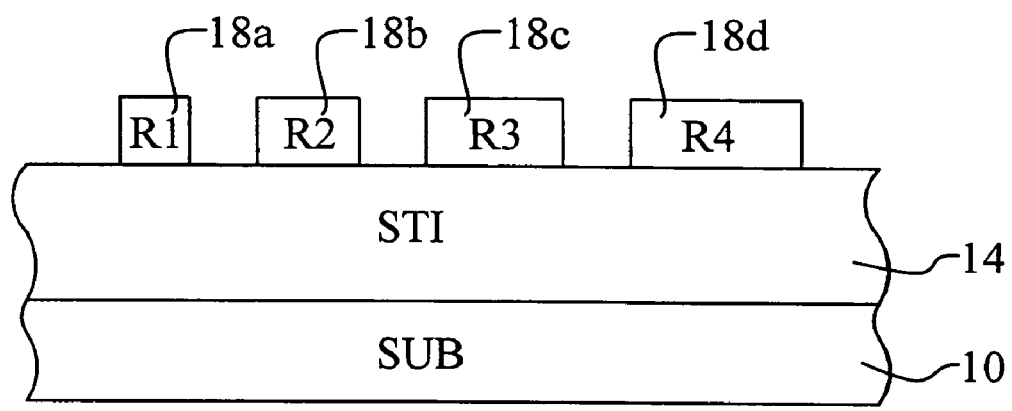

Referring now to FIG. 3, the semiconductor layer 18 is patterned to form a plurality of lines R1 18a, R2 18b, R3 18c, and R4 18d. The patterning may be performed using any of the known methods. For example, a photosensitive film, not shown, may be deposited overlying the semiconductor layer 18. The film is exposed to actinic light through a mask and then developed. The photosensitive film will expose the semiconductor layer 18 according to the pattern of the mask. The exposed semiconductor layer 18 is then etched away using the film as an on-chip mask. The photosensitive film is then stripped away. The resulting lines R1 18a, R2 18b, R3 18c, and R4 18d can be made the same width. More preferably, each line is made to a width that corresponds to the desired relative resistance of that line. The most resistive lines are made the thinnest. Likewise, by making a line wider, such as in the case of R4 18d, that line can carry a large current density without being blown open. This feature can be optimal used to tailor the order that the lines will blow. In the example, four lines R1 18a, R2 18b, R3 18c, and R4 18d are formed. In practice, the device comprises two or more lines.

Figure 4:
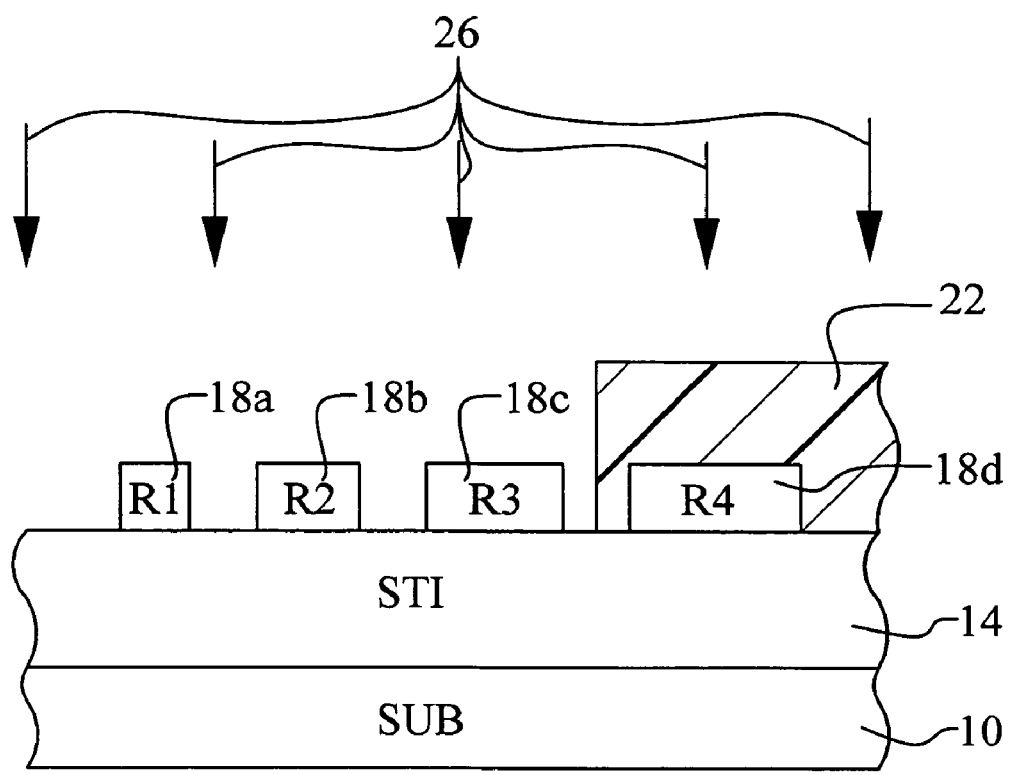

Referring now to FIG. 4, another important feature of the present invention is illustrated. As described above, the lines R1 18a, R2 18b, R3 18c, and R4 18d may be selectively doped to create optimal resistivity values for the lines. In this exemplary case, ions are implanted 26 into lines R1 18a, R2 18b, and R3 18c to reduce the resistivity of these lines. A doping mask 22 is defined such that it covers the R4 18d line and prevents the ion implantation 26 into that line 18d. In this way, the doped group of lines R1 18a, R2 18b, and R3 18c have a lower resistivity than the non-doped group of lines R4 18d.

Figure 5:
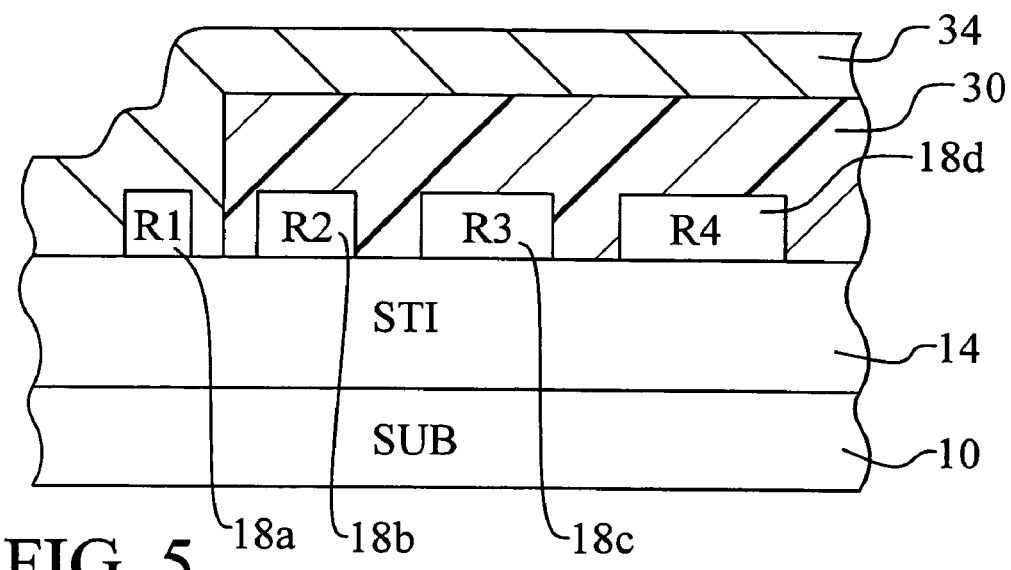

Referring now to FIG. 5, an important feature of the present invention is illustrated. A second masking layer 30 is formed exposing a first group of lines while covering a second group of lines. As shown, the first group of lines comprises line R1 18a and the second group of lines comprises lines R2 18b, R3 18c, and R4 18d. The second masking layer 30 preferably comprises a photosensitive or photoresist layer and may be patterned as described above. A metal layer 34 is then formed overlying the second masking layer 30 and the exposed lines R1 18a. The metal layer 34 preferably comprises a metal that will react with the semiconductor layer 18 to form a metal-semiconductor alloy. If the semiconductor layer 18 comprises silicon or polysilicon, as is preferred, then it is also preferred that the metal layer 34 comprises cobalt, titanium, nickle, or platinum. The metal layer 34 may be formed by physical or chemical vapor deposition to a thickness of between about 10 Å and about 300 Å.

Figure 6:
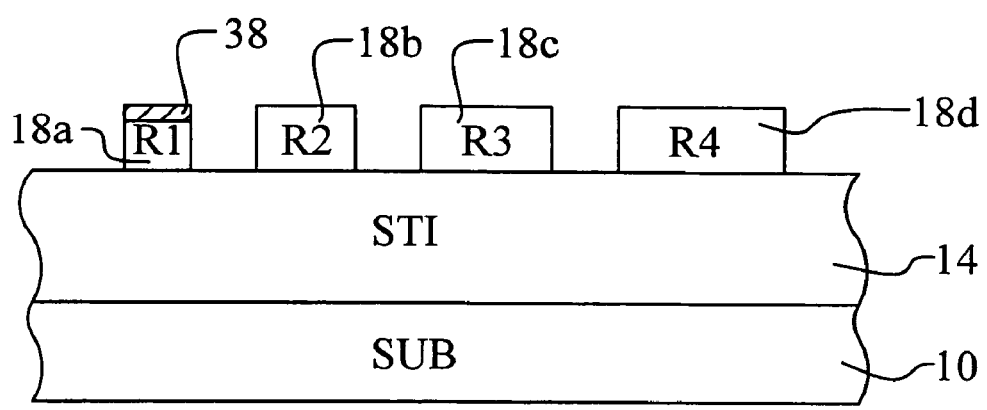

Next, the metal layer 34 and the semiconductor layer 18 are annealed to catalyze the formation of metal-semiconductor alloy on the exposed line R1 18a. For example, the integrated circuit device may be heated to a temperature of between about 300° C. and about 800° C. Referring now to FIG. 6, a metal-semiconductor alloy layer 38 is formed only on the exposed line R1 18a. In the preferred case, where the semiconductor layer 18 is silicon or polysilicon, the metal-semiconductor alloy layer 38 comprises a metal silicide material such as $TiSi_2$, $CoSi_2$, NiSi, or $PtSi_x$. The metal-semiconductor alloy layer 38 is preferably formed to a thickness of between about 10 Å and about 300 Å. Following the anneal step, the unreacted metal layer 34 is removed.

Referring again to FIG. 1, the resulting programmable fuse device is again shown in top view. As noted in the preferred embodiment of the method of formation, the lines R1 18a, R2 18b, R3 18c, and R4 18d are formed such that R1 18a is the only line with the metal-semiconductor alloy, such that lines R1 18a, R2 18b, and R3 18c are doped, and such that line R4 18d is neither doped nor features the metal-semiconductor alloy.

In the beginning state, the resistance of the device comprises the parallel combination of the resistance of lines R1-R4. This is the first resistance of the device and represents the first stored state of the device. Note that the first state, where all the lines are connected, represents the smallest resistance of the device.

Figure 7:
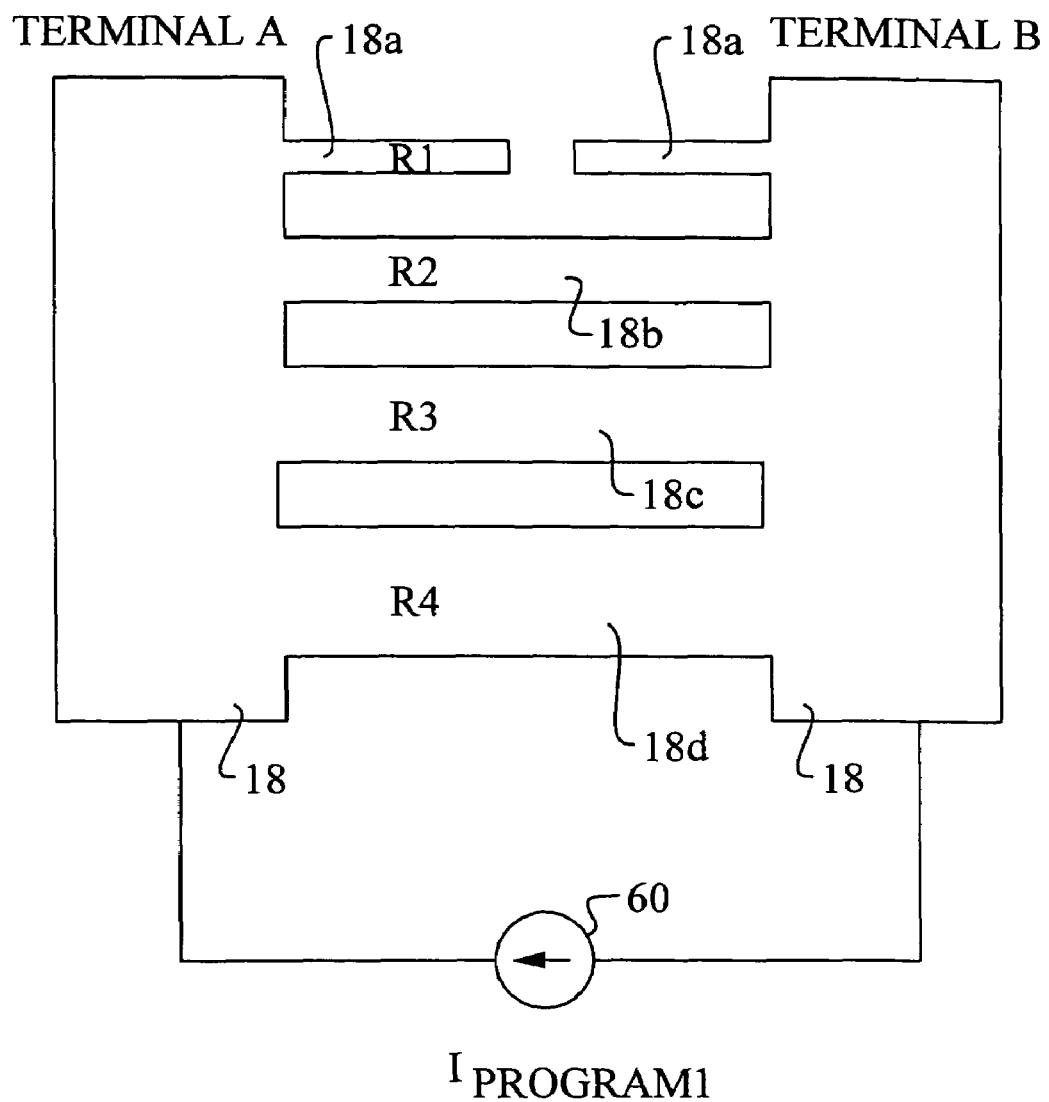
FIGS. 7 and 8 illustrate a preferred embodiment of the present invention showing a method to program the programmable resistor device.

Referring now to FIG. 7, a first programming of the device is now performed. A first programming current $I_{PROGRAM1}$ is forced through the device from TERMINAL A to TERMINAL B. The first programming current $I_{PROGRAM1}$ is large enough to cause the weakest line in the device to be blown open. In this case, the weakest line is R1 18a. R1 18a is the weakest line for several reasons. First, the inclusion of the metal-semiconductor alloy greatly reduces the resistivity of the line. Second, line R1 is doped. Third, line R1 is the thinnest line. As a result, most of the programming current is conducted in the R1 line. When the thermal capability of the metal-semiconductor alloy layer is exceeded, this layer is blown open. At this point, the excessive current is immediately conducted in the bulk of line R1 and rapidly exceeds the thermal limit of the semiconductor layer. Therefore, line R1 is blown open as shown. The first programming current $I_{PROGRAM1}$ is designed to be a brief pulse that is large enough in value to blow the weakest line R1 without damaging the other lines R2-R4.

As a result of the first programming pulse, the device is programmed to the second state. In the second state, the weakest line R1 is blown open while the remaining lines R2-R4 are left connected. As a result, the device resistance is transformed to a higher value due to the absence of R1. This second resistance value corresponds to the second state of the programmable resistor device.

Figure 8:
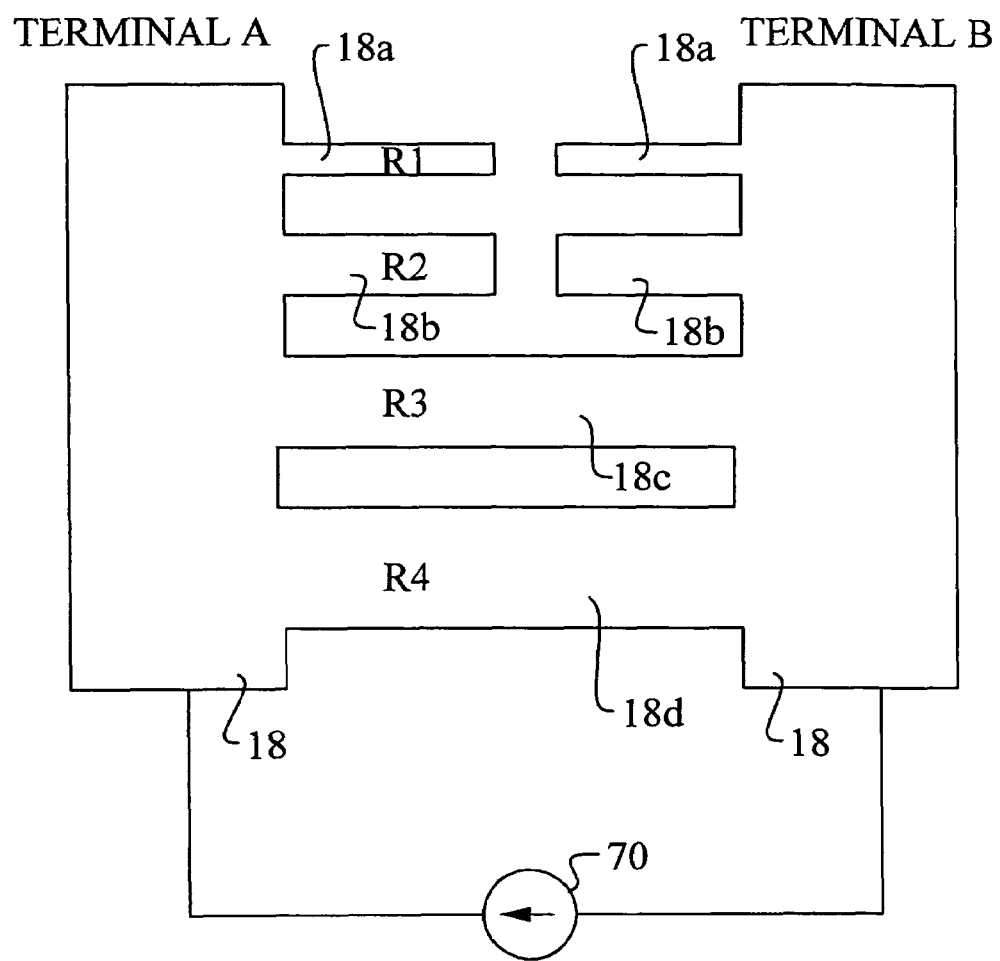

Referring now to FIG. 8, the programming method is repeated to program the device from the second state to the third state. A second programming current $I_{PROGRAM2}$ is force through the device from TERMINAL A to TERMINAL B. The current $I_{PROGRAM2}$ and duration is sufficient to blow open the next weakest line R2. In this case, line R2 is a doped line. Since this line is the thinnest remaining line, the thermal ability is the least. After the R2 line is blown, the device enters the third state. The third state corresponds to a third resistance that is the parallel combination of R3 and R4. The sequence may be repeated yet a third time to blow open the R3 line 18c and to program the device to the fourth state where the resistance of the device is merely R4.

It can be seen how the unique combination of features of the present invention creates an advantageous device. The device uses a parallel combination of a plurality of lines, the selective formation of a metal-semiconductor alloy on a first group of lines but not a second group of lines, and the selective doping of some lines yet not other lines. The resulting device is particularly useful as a programmable, or trimmable, resistance value for analog circuits. It can be used in combination with built-in self-test (BIST) or built-in self-repair (BISR) circuits. The fuse is scaleable with the prevailing technology of the integrated circuit device. Multiple logical levels may be programmed by repeating the programming pulse. The polysilicon fuse structure of the present invention consists of strips with combinations of N, P, or intrinsic dopant regions and/or silicide or non-silicide regions. This is a unique structure that differs substantially from variable resistor structures formed using variable length or width polysilicon strips.

The resulting programmable resistor device may be applied advantageously to the formation of a chip identifier for an integrated circuit device. A single such programmable resistor, or a combination of such programmable resistors, may be used to form a unique identifier for an integrated circuit device.

The advantages of the present invention may now be summarized. An effective and very manufacturable integrated circuit device is achieved. A method to form a programmable polysilicon fuse device capable of multiple states is achieved. The method of formation has minimal impact on a standard CMOS process. The method allows the state of the device to depend on the parallel combination of polysilicon resistors. The method allows the device to be capable of performing in more than two states depending on how many resistors are blown open. The method allows utilizes relative resistance of the resistor lines controlled by the selective formation of metal silicide. The method utilizes the relative resistance of the resistor lines controlled by the selective doping of the resistor. A method to program the programmable polysilicon fuse device using on-chip current sources is achieved. The method to program the programmable polysilicon fuse device is capable of programming to more than two states using multiple pulses of current.

As shown in the preferred embodiments, the novel methods and device of the present invention provide an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A programmable resistor device in an integrated circuit device, comprising:

a substrate with overlying individual lines disposed between a first terminal and a second terminal, wherein any of the individual lines may be blown open by a current forced from the first terminal to the second terminal; and a first line of the individual lines having a resistance different form a second line, wherein the individual lines are directly on a shallow trench isolation or a local field oxidation (LOCOS) overlaying the substrate.

2. The device according to claim 1 wherein the resistance of the first line is lower than that of the second line.

3. The device according to claim 1 wherein a line width of the second line is wider than that of the first line.

4. The device according to claim 1 wherein the substrate comprises a semiconductor layer.

5. The device according to claim 4 wherein the semiconductor layer comprises silicon or polysilicon.

6. The device according to claim 1 wherein the programmable resistor device is a chip identifier for the integrated circuit device.

7. The device according to claim 1 wherein the individual lines comprises a semiconductor layer.

* * * * *